US009917210B1

(12) United States Patent
Bao et al.

(10) Patent No.: US 9,917,210 B1
(45) Date of Patent: Mar. 13, 2018

(54) FINFET TRANSISTOR GATE AND EPITAXY FORMATION

(71) Applicant: International Business Machines Corporation, Armonk, NY (US)

(72) Inventors: Ruqiang Bao, Niskayuna, NY (US); Zhenxing Bi, Niskayuna, NY (US); Kangguo Cheng, Schenectady, NY (US); Zheng Xu, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/298,417

(22) Filed: Oct. 20, 2016

(51) Int. Cl.
H01L 29/788 (2006.01)
H01L 29/66 (2006.01)
H01L 29/417 (2006.01)
H01L 29/06 (2006.01)
H01L 29/78 (2006.01)
H01L 29/49 (2006.01)

(52) U.S. Cl.
CPC ...... H01L 29/7889 (2013.01); H01L 29/0649 (2013.01); H01L 29/41791 (2013.01); H01L 29/4916 (2013.01); H01L 29/66553 (2013.01); H01L 29/66795 (2013.01); H01L 29/66825 (2013.01); H01L 29/785 (2013.01)

(58) Field of Classification Search
CPC ............ H01L 29/7889; H01L 29/0649; H01L 29/41791; H01L 29/4916; H01L 29/66553; H01L 29/66795; H01L 29/66825; H01L 29/785
See application file for complete search history.

(56) References Cited

U.S. PATENT DOCUMENTS

| 8,937,353 | B2 | 1/2015 | Chen et al. |
| 9,029,930 | B2 | 5/2015 | Kelly et al. |
| 9,293,586 | B2 | 3/2016 | Hu et al. |
| 9,330,984 | B1 | 5/2016 | Leobandung et al. |
| 2011/0097889 | A1 | 4/2011 | Yuan et al. |

(Continued)

OTHER PUBLICATIONS

Du et al. "Optimization of STI oxide recess uniformity for FinFET beyond 20nm," Semiconductor Technology International Conference, CSTIC, China, 2015, 4 pages.

Primary Examiner — Cheung Lee
Assistant Examiner — Stephen C Smith
(74) Attorney, Agent, or Firm — Cantor Colburn LLP; Vazken Alexanian

(57) ABSTRACT

Embodiments are directed to a method of forming a semiconductor device and resulting structures that reduce shallow trench isolation (STI) undercutting, floating gates, and gate voids without degrading epitaxy quality. The method includes forming a first and second semiconductor fin on a substrate. A buffer layer is formed on a surface of the substrate between the first and second semiconductor fins and a semiconducting layer is formed on the buffer layer. The buffer layer is selectively removed and replaced with a dielectric layer. A first gate is formed over a first channel region of the first semiconductor fin and a second gate is formed over a second channel region of the first semiconductor fin. Source and drain epitaxy regions are selectively formed on surfaces of the first gate.

14 Claims, 13 Drawing Sheets

(56) References Cited

U.S. PATENT DOCUMENTS

| | | | |
|---|---|---|---|
| 2014/0054648 A1* | 2/2014 | Itokawa | H01L 29/7853 257/192 |
| 2014/0252497 A1 | 9/2014 | Peng et al. | |
| 2015/0123211 A1 | 5/2015 | Zhang et al. | |
| 2015/0255543 A1 | 9/2015 | Cheng | |
| 2016/0204132 A1 | 7/2016 | Basker et al. | |

* cited by examiner

FINFET TRANSISTOR GATE AND EPITAXY FORMATION

BACKGROUND

The present invention relates in general to semiconductor device fabrication methods and resulting structures. More specifically, the present invention relates to fabrication methods and resulting structures for a semiconductor device that reduce shallow trench isolation (STI) undercutting, floating gates, and gate voids without degrading epitaxy quality.

In contemporary semiconductor device fabrication processes a large number of semiconductor devices, such as field effect transistors (FETs) and on-chip capacitors, are fabricated on a single wafer. Some non-planar device architectures, such as vertical field effect transistors (VFETs), employ semiconductor fins and side-gates that can be contacted outside the active region, resulting in increased device density and some increased performance over lateral devices. In contemporary VFET devices, in contrast to conventional FETs, the source to drain current flows through a vertical pillar in a direction that is perpendicular with respect to a horizontal major surface of the wafer or substrate. A VFET can achieve a smaller device footprint because its channel length is decoupled from the contacted gate pitch.

SUMMARY

According to one or more embodiments of the present invention, a method of fabricating a semiconductor device that reduces STI undercutting, floating gates, and gate voids without degrading epitaxy quality is provided. The method can include forming a first and second semiconductor fin on a substrate. A buffer layer is formed on a surface of the substrate between the first and second semiconductor fins and a semiconducting layer is formed on the buffer layer. The buffer layer is selectively removed and replaced with a dielectric layer. A first gate is formed over a first channel region of the first semiconductor fin and a second gate is formed over a second channel region of the first semiconductor fin. Source and drain epitaxy regions are selectively formed on surfaces of the first gate.

According to one or more embodiments of the present invention, a method of fabricating a semiconductor device that reduces STI undercutting, floating gates, and gate voids without degrading epitaxy quality is provided. The method can include forming a plurality of adjacent semiconductor fins on a substrate. Each semiconductor fin includes a first sidewall and a second sidewall. A buffer layer is formed on a surface of the substrate between each of the semiconductor fins and a semiconducting layer is formed on the buffer layer. The semiconducting layer defines a fin height of the semiconductor fins. The method can include selectively removing the buffer layer and forming a dielectric layer to replace the removed buffer layer.

According to one or more embodiments of the present invention, a structure that reduces STI undercutting, floating gates, and gate voids without degrading epitaxy quality is provided. The structure can include a first and a second semiconductor fin formed on a substrate. The structure can include a dielectric layer formed on a surface of the substrate between the first and second semiconductor fins and a semiconducting layer on the dielectric layer. The semiconducting layer defines a fin height of the first and second semiconductor fins. The structure can include a first gate formed over a first channel region of the first semiconductor fin and a second gate formed over a second channel region of the first semiconductor fin. The structure can include a first epitaxy region formed on a first surface of the first gate and a second epitaxy region formed on a second surface of the first gate.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
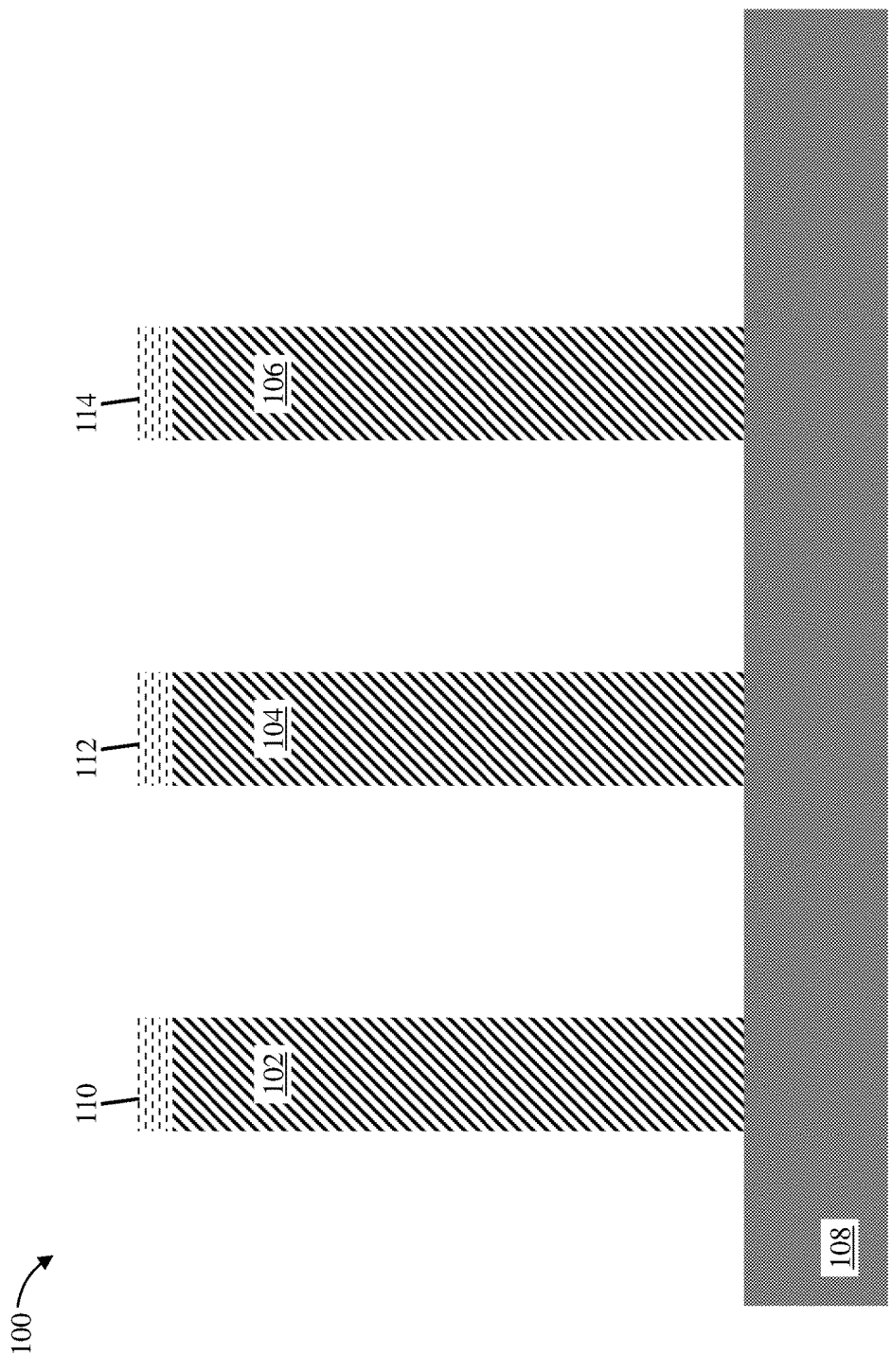
FIG. 1 depicts a cross-sectional view of a structure having semiconductor fins formed on a substrate during an intermediate operation of a method of fabricating a semiconductor device according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

As used herein, the term "conformal" means that the thickness of, e.g., a conformal liner is substantially the same on all surfaces, or that the thickness variation is less than 15% of the nominal thickness.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to the present invention, as previously noted herein, non-planar device architectures such as vertical fin and nanosheet FET devices result in increased device density over lateral devices. There are challenges, however, in providing non-planar architectures for scaling beyond the 10 nm node. For example, STI undercutting and floating gate structures caused by hydrofluoric acid (HF) inadvertently over etching during spacer or epitaxy CMOS modules is increasingly challenging to address. Epitaxy pre-cleaning HF reduction mitigates the structural damage but results in a degraded epitaxy quality. Another challenge, especially for high aspect ratio fins, is to prevent voids from forming between adjacent fins by ensuring complete gate material gap filling. Thus, a method is desired for forming a semiconductor device that reduces STI undercutting, floating gates, and gate voids without degrading epitaxy quality.

Turning now to an overview of the aspects of the present invention, one or more embodiments provide methods of fabricating a semiconductor device that reduce STI undercut, floating gates, and gate voids without degrading epitaxy quality. The formation of gate material gap filling voids is avoided through an integrated early SiGe/Si stack layer growth, isotropic SiGe selective etch, and dielectric reflow process that entirely obviates the need for gap filling materials (e.g., amorphous silicon). The dielectric (e.g., silicon nitride) serves as both a local and global STI material to prevent STI undercutting and floating gate formation during CMOS epitaxy.

Example methods for fabricating a semiconductor device that reduce STI undercutting, floating gates, and gate voids without degrading epitaxy quality and the resulting structures therefrom in accordance with embodiments of the present invention are described in detail below by referring to the accompanying drawings in FIGS. 1-13.

FIG. 1 illustrates a cross-sectional view of a structure 100 having semiconductor fins 102, 104, and 106 formed on a substrate 108 during an intermediate operation of a method of fabricating a semiconductor device according to one or more embodiments. For ease of discussion reference is made to operations performed on and to a substrate having three adjacent semiconductor fins. It is understood, however, that the substrate 108 can include any number of semiconductor fins. Hard masks 110, 112, and 114, respectively, are formed on a surface of the semiconductor fins 102, 104, and 106.

The semiconductor fins 102, 104, and 106 can be formed on the substrate 108 using known semiconductor fabrication techniques. For example, in some embodiments, a patterned hard mask (not depicted) is etched to expose portions of the substrate 108. The exposed portions of the substrate 108 can then be removed to form a plurality of semiconductor fins. The patterned hard mask is then removed using an etch process, which can be a wet etch process, a dry etch process or a combination thereof.

The semiconductor fins 102, 104, and 106 can be any suitable material, such as, for example, Si, SiGe, Group III-V channel material, or other suitable channel materials. Group III-V channel materials include materials having at least one group III element and at least one group V element, such as, for example, one or more of aluminum gallium arsenide, aluminum gallium nitride, aluminum arsenide, aluminum indium arsenide, aluminum nitride, gallium antimonide, gallium aluminum antimonide, gallium arsenide, gallium arsenide antimonide, gallium nitride, indium antimonide, indium arsenide, indium gallium arsenide, indium gallium arsenide phosphide, indium gallium nitride, indium nitride, indium phosphide and alloy combinations including at least one of the foregoing materials. In some embodiments, the semiconductor fins 102, 104, and 106 are formed on a bottom doped region (not depicted) of the substrate 108. The bottom doped region can be a source or drain region formed on the substrate 108 by a variety of methods, such as, for example, diffusion, ion implantation of a dopant into the substrate, or in-situ doped epitaxy.

The hard masks 110, 112, and 114 can be any suitable material, such as, for example, a nitride or a silicon nitride. In some embodiments, the hard masks 102, 104, and 106 are silicon dioxide hard masks. In some embodiments, the fin pitch, or spacing, between each semiconductor fin (e.g., between semiconductor fins 102 and 104) can be about 20 nm to about 150 nm. In other embodiments, the fin pitch is about 30 nm to about 50 nm.

The substrate 108 can be any suitable substrate material, such as, for example, monocrystalline Si, SiGe, SiC, III-V compound semiconductor, II-VI compound semiconductor, or semiconductor-on-insulator (SOI). In some embodiments, the substrate 108 includes a buried oxide layer (BOX).

Figure 2:
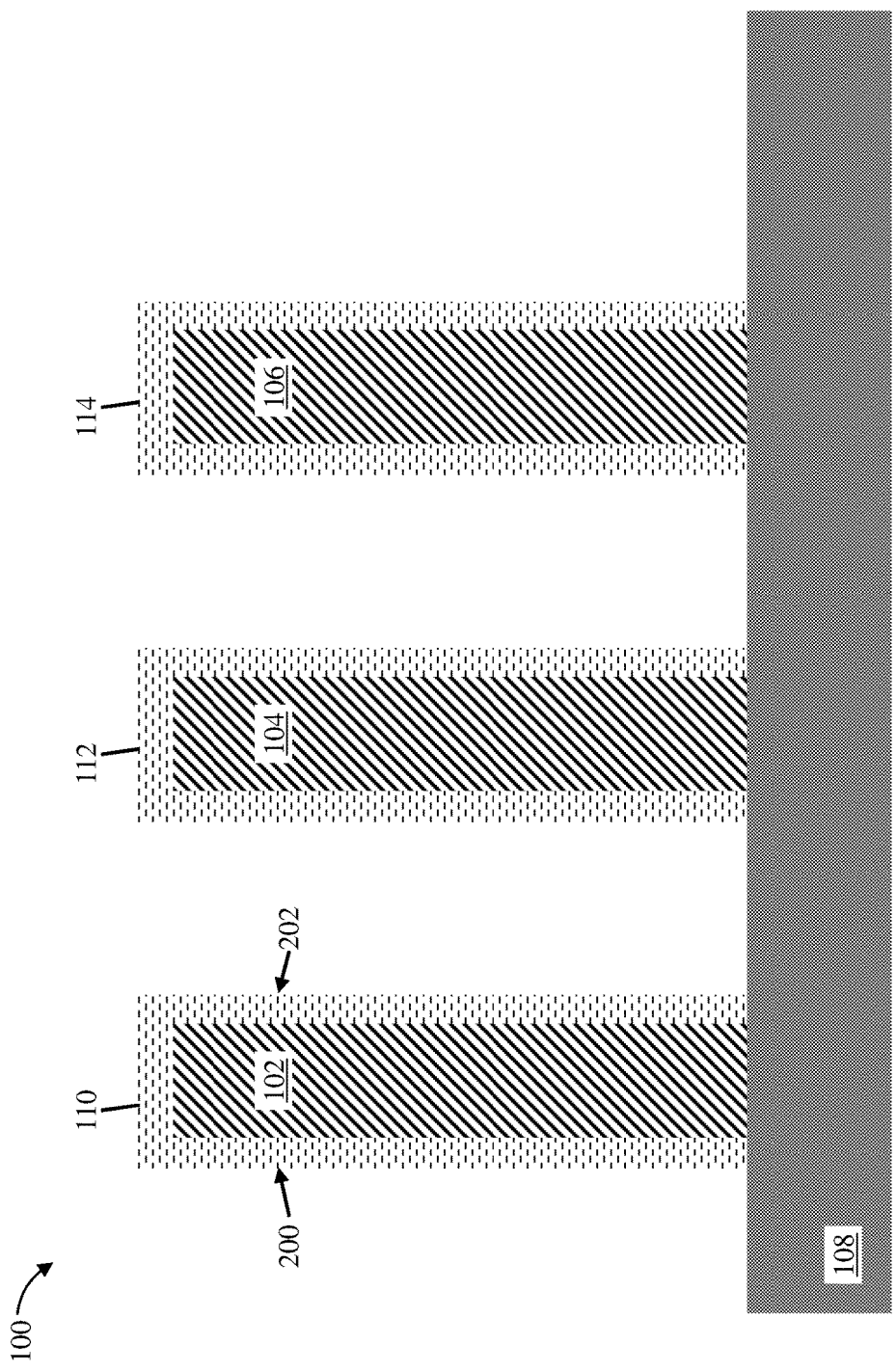
FIG. 2 depicts a cross-sectional view of the structure after forming spacers on opposite sidewalls of the semiconductor fins during an intermediate operation of a method of fabricating a semiconductor device according to one or more embodiments of the present invention.

FIG. 2 illustrates a cross-sectional view of the structure 100 after forming spacers 200 and 202 on opposite sidewalls of the semiconductor fin 102 during an intermediate operation of a method of fabricating a semiconductor device according to one or more embodiments. For ease of discussion only spacers 200 and 202 are provided with reference numbers. It is understood that spacers can be formed on sidewalls of each of the semiconductor fins. The spacers 200 and 202 can be of any suitable material, such as, for example, a low-k dielectric, a nitride, silicon nitride, silicon dioxide, a silicon oxynitride (SiON), a silicon carbide (SiC), a silicon oxygen carbonitride (SiOCN), or a silicoboron carbonitride (SiBCN). In some embodiments, the spacers 200 and 202 are silicon dioxide spacers. The spacers 200 and 202 can be formed using any known process, such as, for example, CVD, PECVD, ALD, PVD, chemical solution deposition, or other like processes in combination with a wet or dry etch process. In some embodiments, the spacers 200 and 202 are conformally formed over the substrate 108 and the semiconductor fins 102, 104, and 106 using ALD followed by directional RIE.

Figure 3:
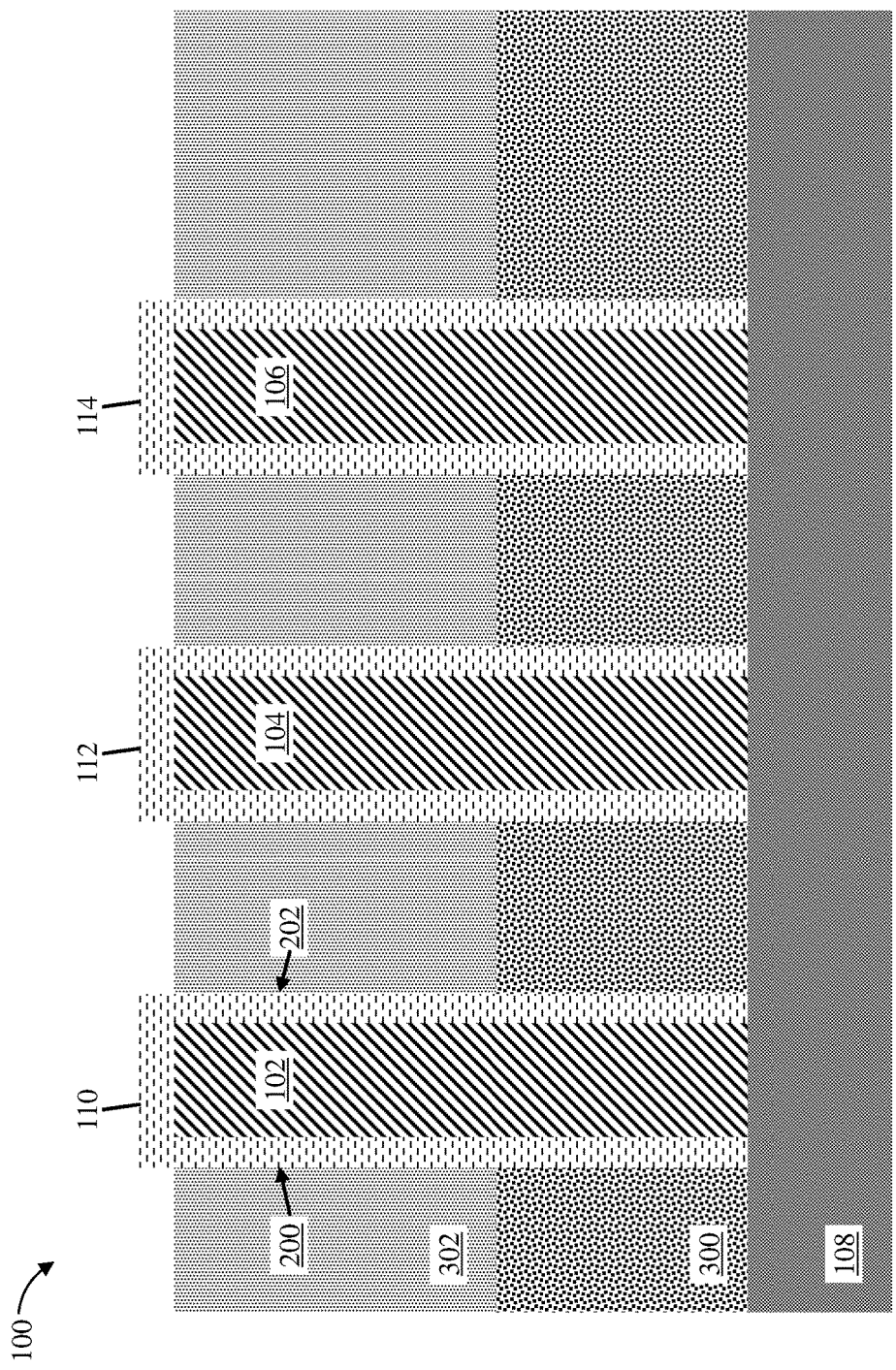
FIG. 3 depicts a cross-sectional view of the structure after forming a buffer layer on a surface of the substrate between the semiconductor fins during an intermediate operation of a method of fabricating a semiconductor device according to one or more embodiments of the present invention.

FIG. 3 illustrates a cross-sectional view of the structure 100 after forming a buffer layer 300 on a surface of the substrate 108 between the semiconductor fins 102, 104, and 106 during an intermediate operation of a method of fabricating a semiconductor device according to one or more embodiments. In some embodiments, the buffer layer 300 is SiGe. The buffer layer 300 can be formed using any suitable process, such as, for example, CVD or ALD. Semiconducting layer 302 is formed on the buffer layer 300. Semiconducting layer 302 can be formed using, for example, epitaxial growth, CVD, ECD, MBE, or ALD. In some embodiments, semiconducting layer 302 is silicon.

Figure 4:
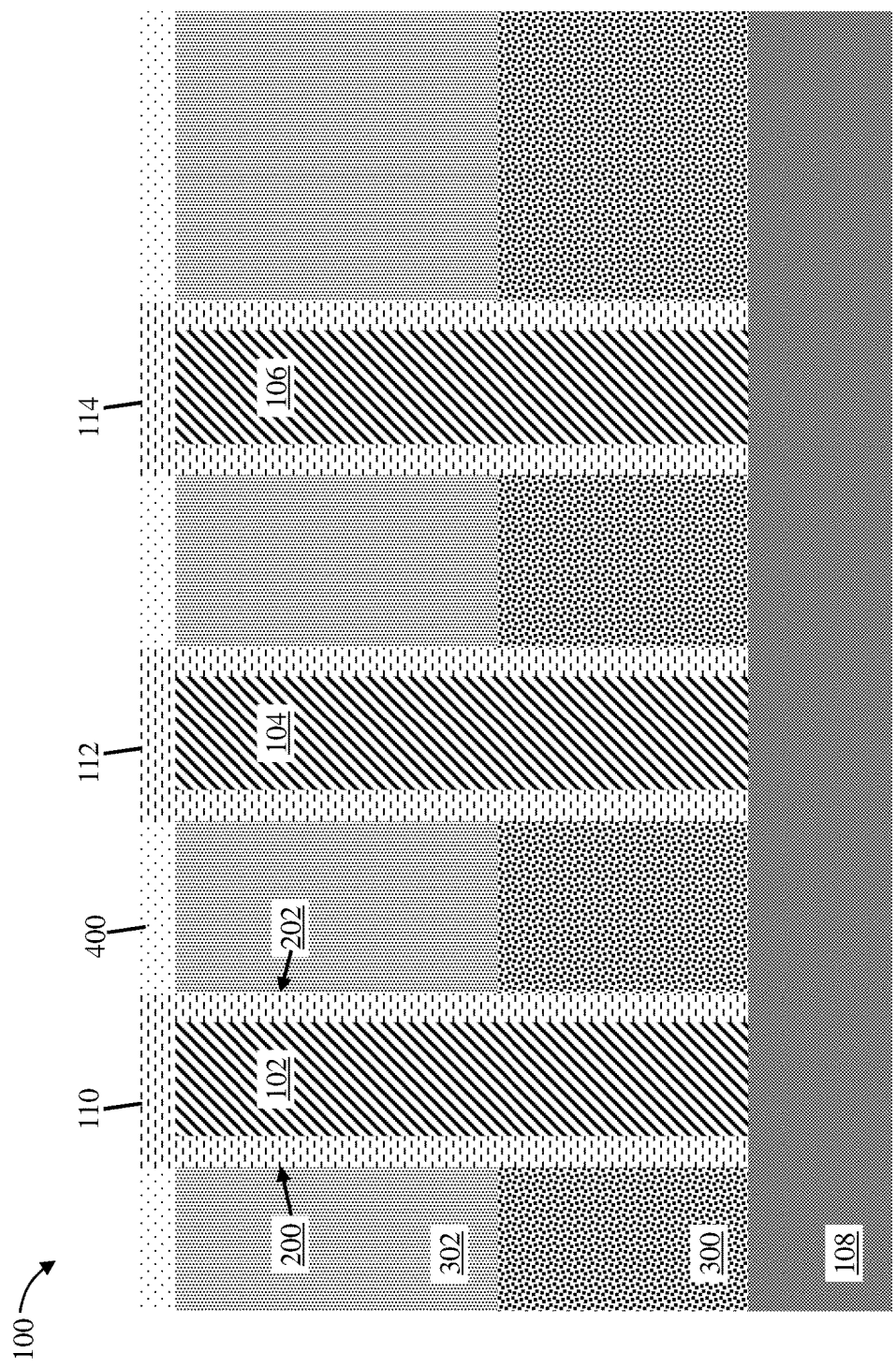
FIG. 4 depicts a cross-sectional view of the structure after forming a dielectric layer on a surface of a semiconducting layer between the semiconductor fins during an intermediate operation of a method of fabricating a semiconductor device according to one or more embodiments of the present invention.

FIG. 4 illustrates a cross-sectional view of the structure 100 after forming a dielectric layer 400 on a surface of the semiconducting layer 302 between the semiconductor fins 102, 104, and 106 during an intermediate operation of a method of fabricating a semiconductor device according to one or more embodiments. In some embodiments, the dielectric layer 400 is silicon nitride. In some embodiments, the dielectric layer 400 is formed by selective silicon nitride deposition. The dielectric layer 400 can be planarized to a surface of the hard masks 110, 112, and 114 using, for example, CMP selective to the hard masks 110, 112, and 114.

Figure 5:
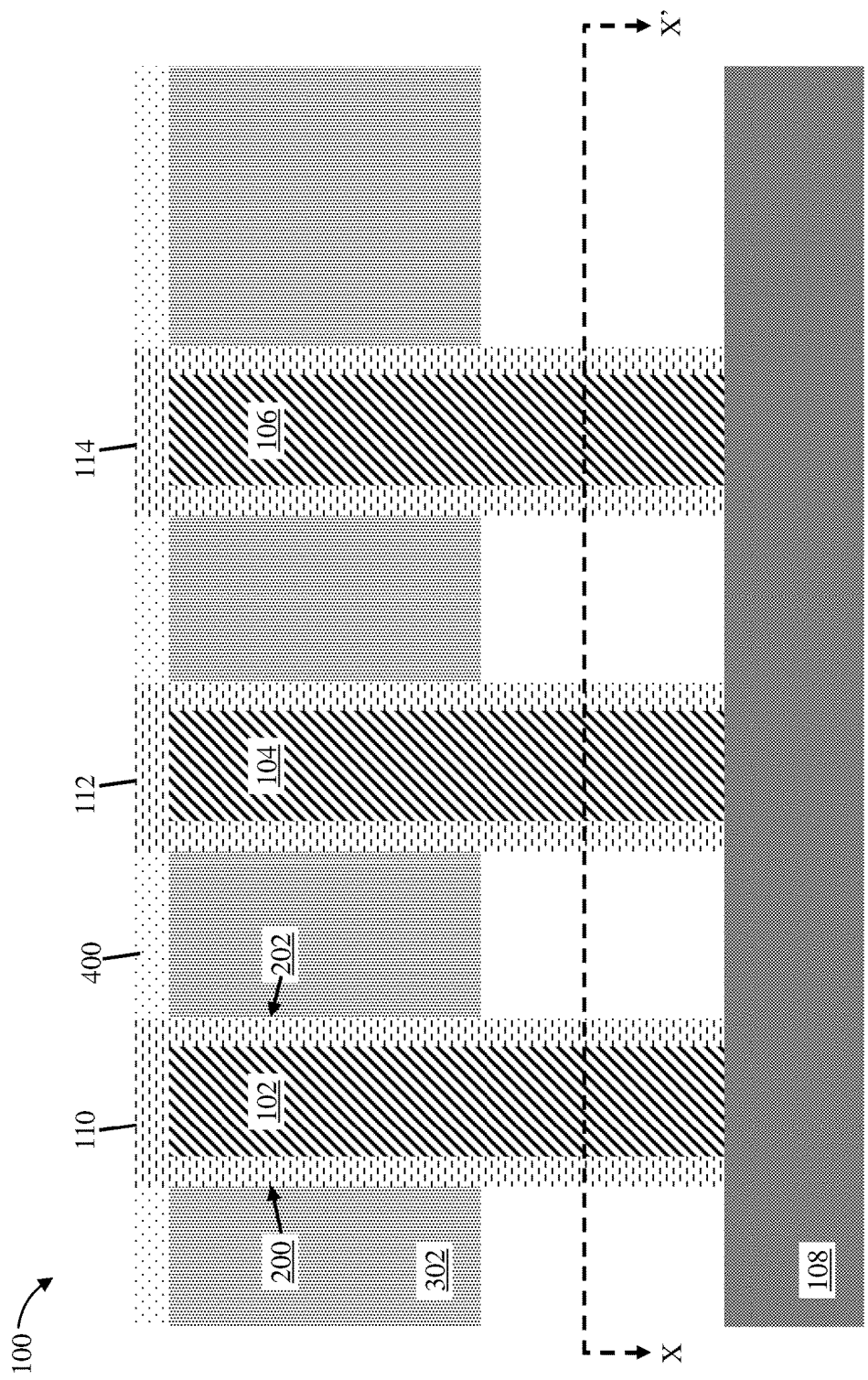
FIG. 5 depicts a cross-sectional view of the structure after removing the buffer layer during an intermediate operation of a method of fabricating a semiconductor device according to one or more embodiments of the present invention.

FIG. 5 illustrates a cross-sectional view of the structure 100 after removing the buffer layer 300 during an intermediate operation of a method of fabricating a semiconductor device according to one or more embodiments. In some embodiments, a fin cut (not depicted) is made to expose opposite ends of the semiconductor fins 102, 104, and 106. The buffer layer 300 is then selectively removed. In some embodiments, the buffer layer 300 is a SiGe buffer layer and a SiGe etching process selective to the spacers 200 and 202, the substrate 108, and the semiconducting layer 302 removes the buffer layer 300.

Figure 6:
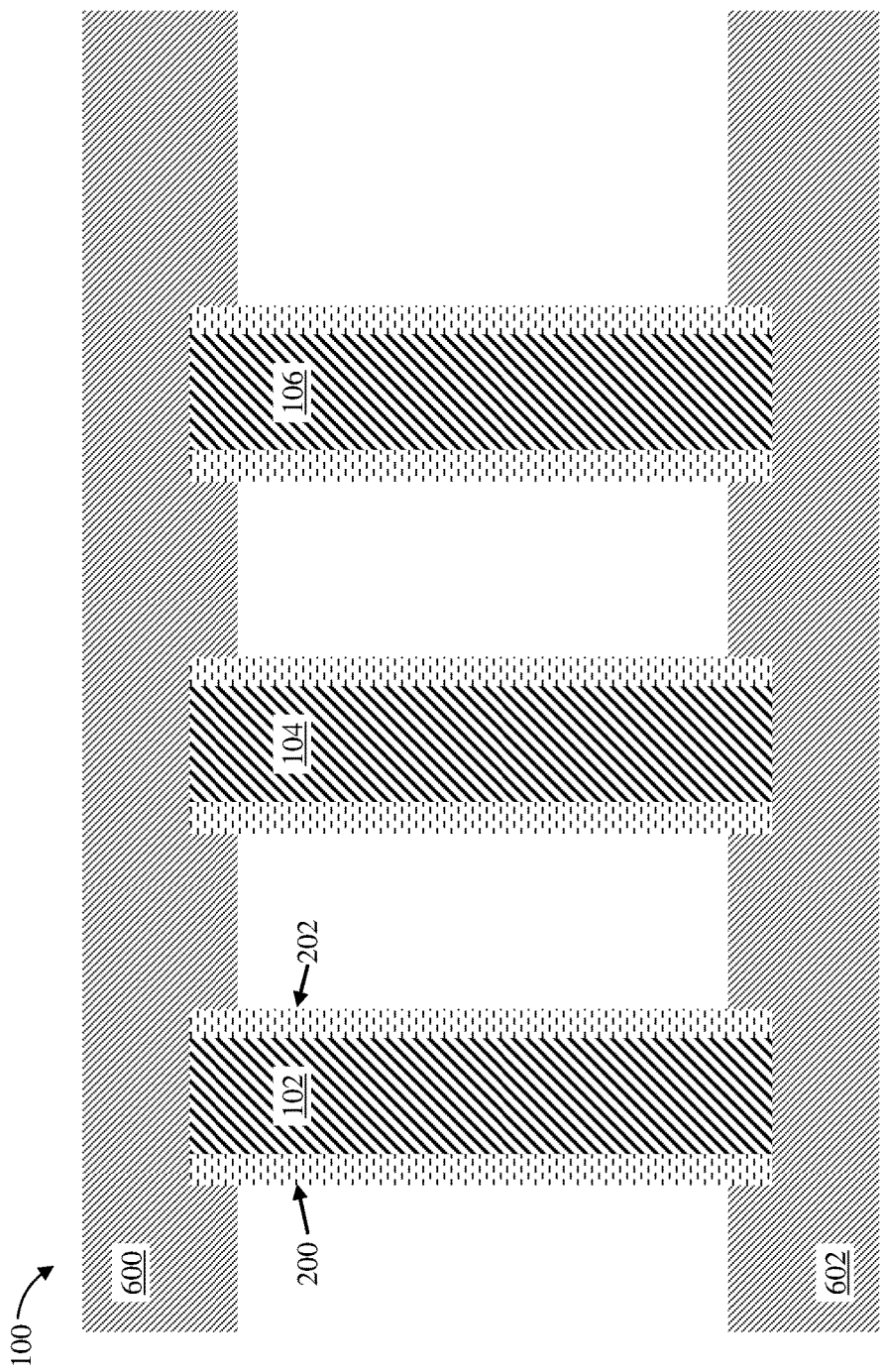
FIG. 6 depicts a top-down cross-sectional view of the structure along the line X-X' of FIG. 5 after removing the buffer layer during an intermediate operation of a method of fabricating a semiconductor device according to one or more embodiments of the present invention.

FIG. 6 illustrates a top-down cross-sectional view of the structure 100 along the line X-X' of FIG. 5 after removing the buffer layer 300 during an intermediate operation of a method of fabricating a semiconductor device according to one or more embodiments. From this view it is clear that the semiconductor fins 102, 104, and 106 are supported between portions 602 and 604 of the substrate 108. The portions 602 and 604 of the substrate 108 support the semiconducting layer 302 after the buffer layer 300 is removed.

Figure 7:
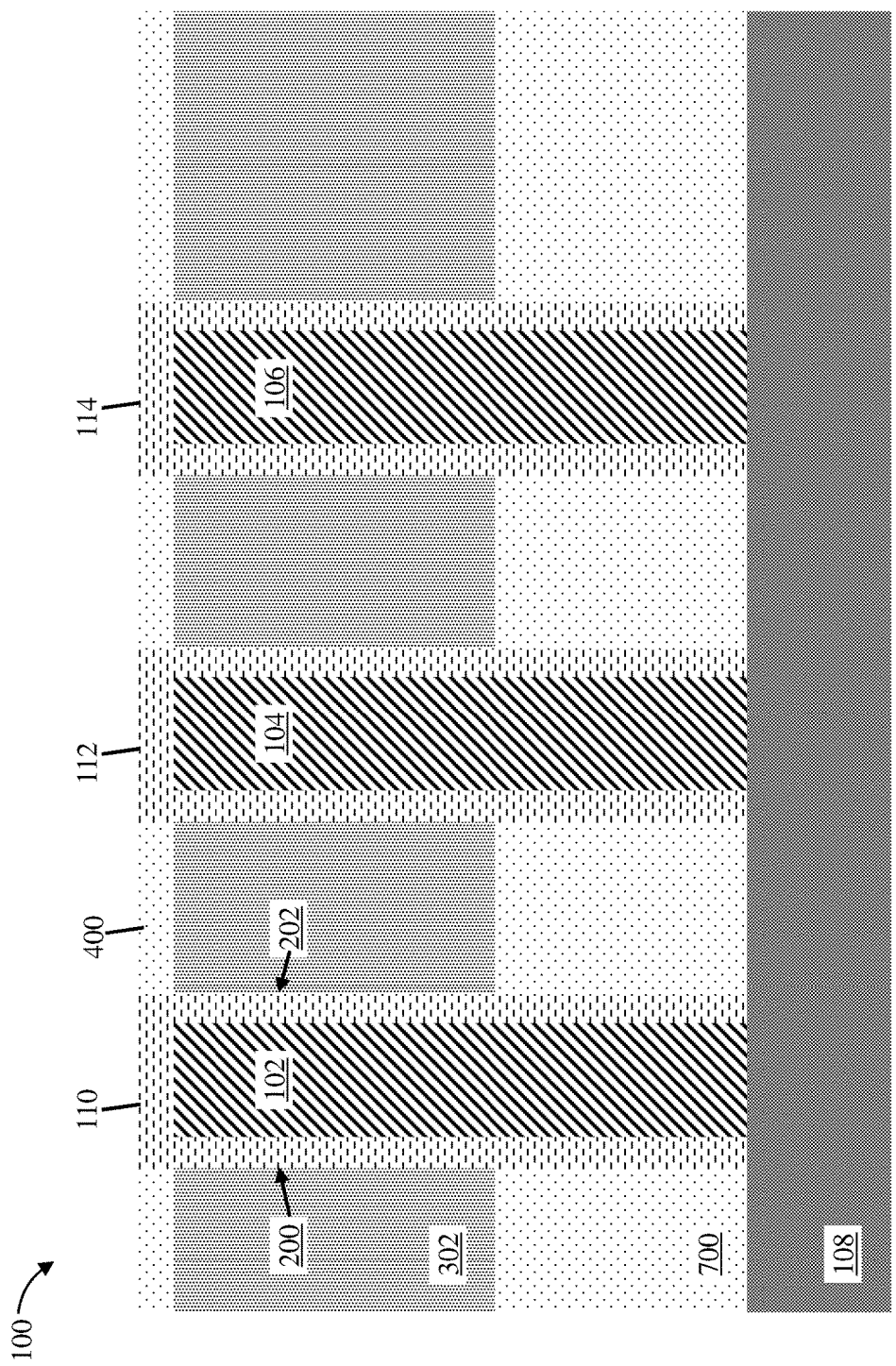
FIG. 7 depicts a cross-sectional view of the structure after forming a dielectric layer between the substrate and the semiconducting layer to replace the removed buffer layer during an intermediate operation of a method of fabricating a semiconductor device according to one or more embodiments of the present invention.

FIG. 7 illustrates a cross-sectional view of the structure 100 after forming a dielectric layer 700 between the substrate 108 and the semiconducting layer 302 to replace the removed buffer layer 300 during an intermediate operation of a method of fabricating a semiconductor device according to one or more embodiments. The dielectric layer 700 acts as a STI region between the semiconductor fins 102, 104, and 106. The dielectric layer 700 can be any suitable material, such as, for example, porous silicates, carbon doped oxides, silicon nitrides, silicon oxynitrides, or other dielectric materials. Any known manner of forming the dielectric layer 700 can be utilized. The dielectric layer 700 can be formed using, for example, CVD, PECVD, ALD, flowable CVD, spin-on dielectrics, or PVD. In some embodiments, the dielectric layer 700 is formed by a flowable silicon nitride deposition. In some embodiments, the dielectric layer 700 is planarized to a top surface of the hard masks 110, 112, and 114, using, for example, a CMP operation.

Figure 8:
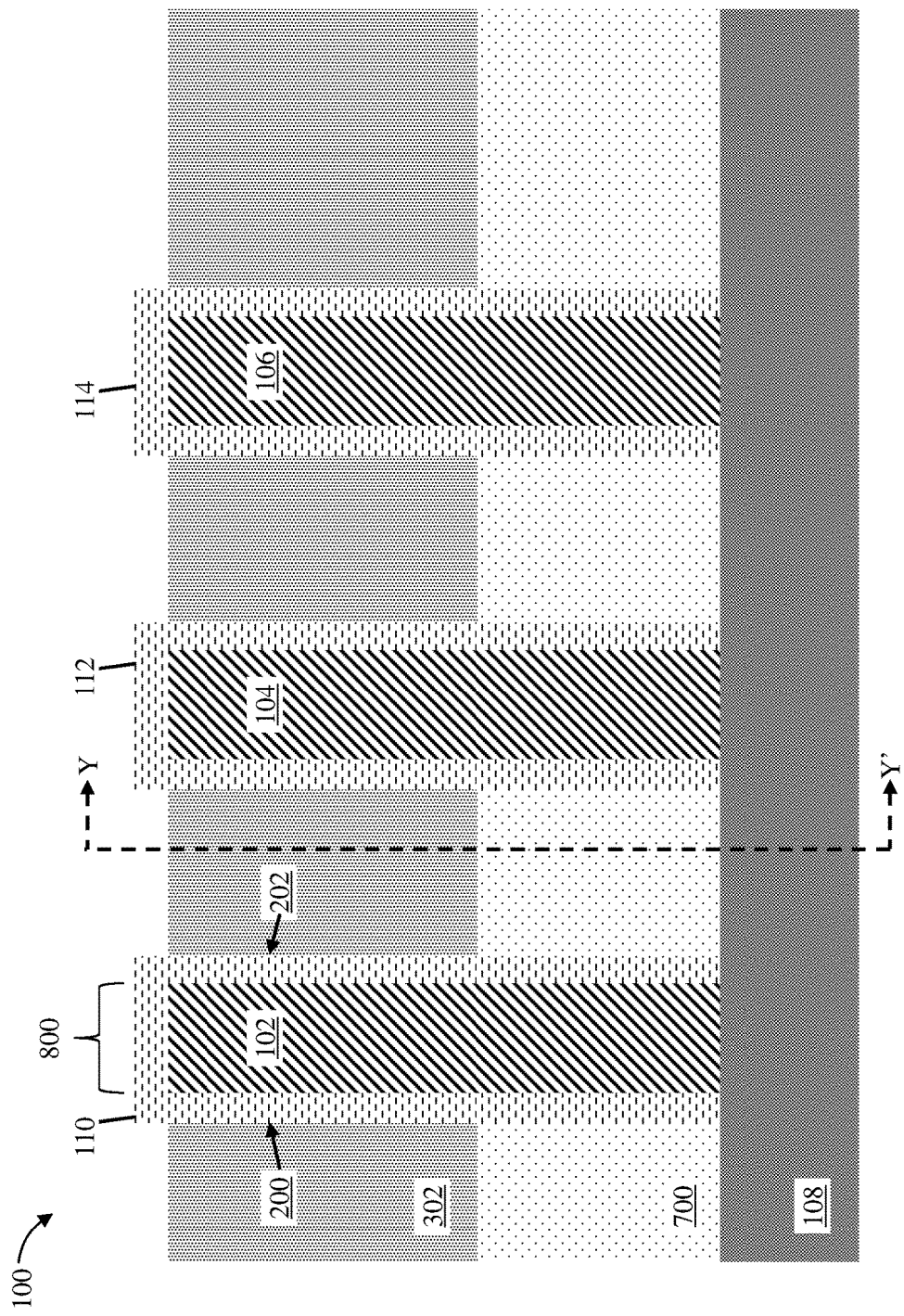
FIG. 8 depicts a cross-sectional view of the structure after removing the dielectric layer to expose a surface of the semiconducting layer during an intermediate operation of a method of fabricating a semiconductor device according to one or more embodiments of the present invention.

FIG. 8 illustrates a cross-sectional view of the structure 100 after removing the dielectric layer 400 to expose a surface of the semiconducting layer 302 during an intermediate operation of a method of fabricating a semiconductor device according to one or more embodiments. Any known manner of removing the dielectric layer 400 can be utilized, such as, for example, a wet or dry etch. In some embodiments, the dielectric layer 400 is etched selective to the semiconducting layer 302 and the spacers 110, 112, and 114. The width of each semiconductor fin (e.g., the width 800 of semiconductor fin 102) defines a channel length of each respective fin.

Figure 9:
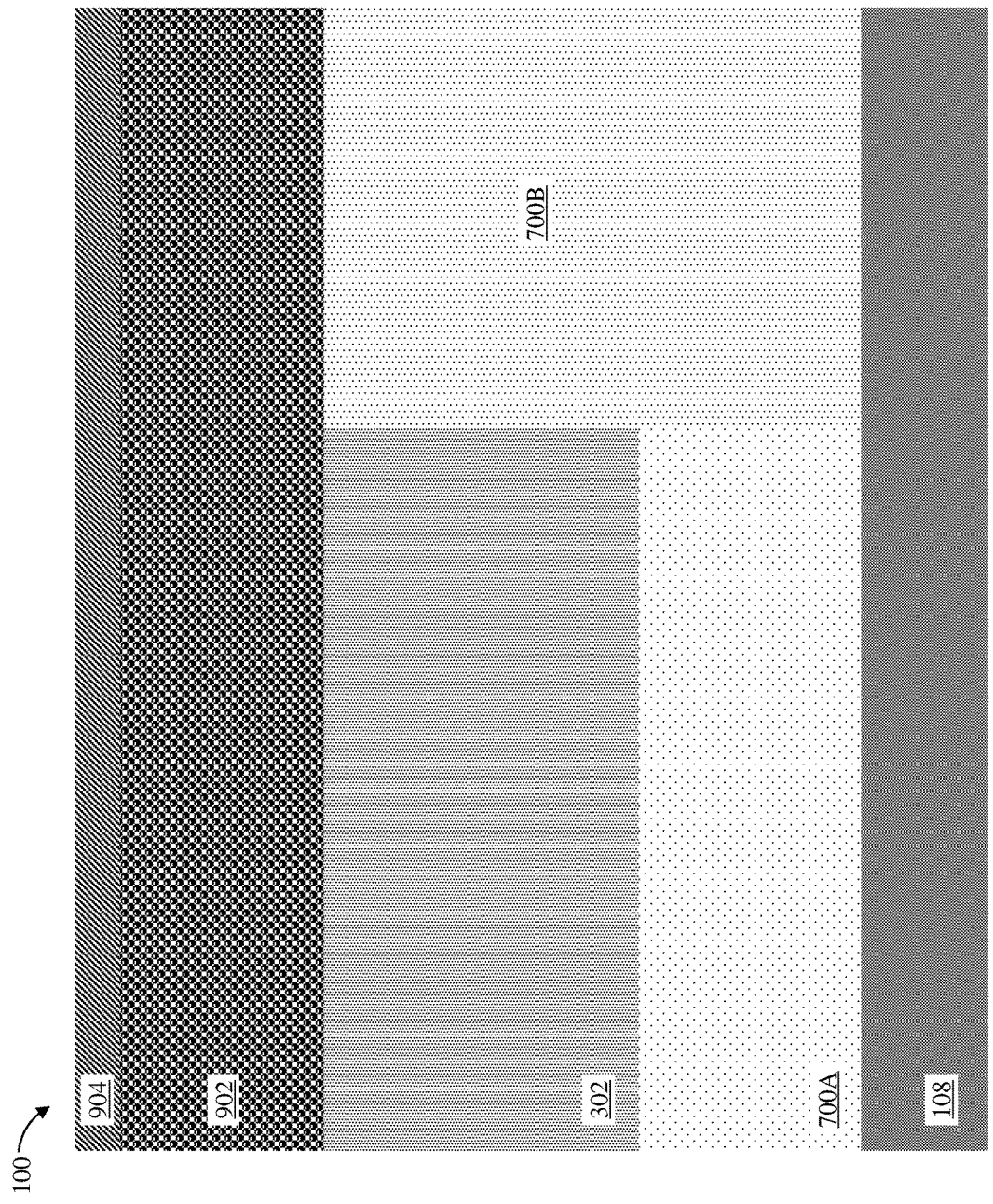
FIG. 9 depicts a cross-sectional view of the structure along the line Y-Y' of FIG. 8 after removing the dielectric layer during an intermediate operation of a method of fabricating a semiconductor device according to one or more embodiments of the present invention.

FIG. 9 illustrates a cross-sectional view of the structure 100 along the line Y-Y' of FIG. 8 after removing the dielectric layer 400 during an intermediate operation of a method of fabricating a semiconductor device according to one or more embodiments. This view depicts a slice of the structure 100 parallel to the semiconductor fins 102, 104, and 106. From this view it is clear that the dielectric layer 700 includes a local STI region 700A and a global STI region 700B.

A dummy gate material layer 902 is formed over the semiconducting layer 302 and the global STI region 700B. The dummy gate material layer 902 can be of any suitable material, such as, for example, poly silicon. A hard mask layer 904 is formed over the gate material layer 902. The hard mask 904 can be formed in a like manner and composition as the spacers 200 and 202 (as depicted in FIG. 2).

Figure 10:
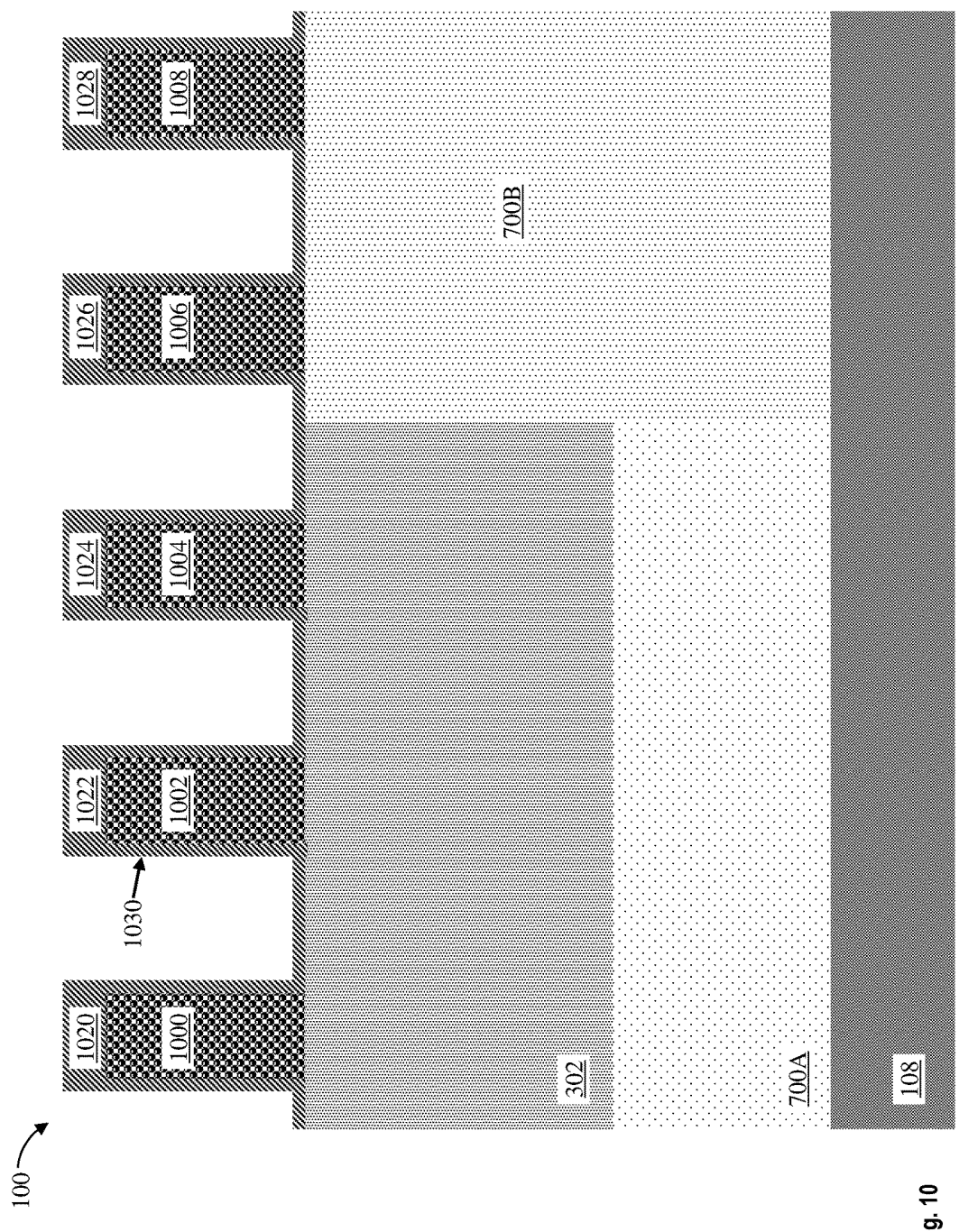
FIG. 10 depicts a cross-sectional view of the structure along the line Y-Y' of FIG. 8 after removing portions of the hard mask layer, gate material layer, and dielectric layer to form sacrificial gates during an intermediate operation of a method of fabricating a semiconductor device according to one or more embodiments of the present invention.

FIG. 10 illustrates a cross-sectional view of the structure 100 along the line Y-Y' of FIG. 8 after removing portions of the hard mask layer 904 and dummy gate material layer 902 to form sacrificial gates 1000, 1002, 1004, 1006, and 1008 during an intermediate operation of a method of fabricating a semiconductor device according to one or more embodiments. Each sacrificial gate 1000, 1002, 1004, 1006, and 1008 is formed over a channel region of the semiconductor fins 102, 104, and 106 (e.g., across a portion of the channel length 800 as depicted in FIG. 8).

The sacrificial gates 1000, 1002, and 1004 each include a hard mask 1020, 1022, and 1024, respectively. The sacrificial gates 1006 and 1008 each include a hard mask 1026 and 1028, respectively. Sacrificial gates 1000, 1002, and 1004 are formed on the semiconducting layer 302. Sacrificial gates 1006 and 1008 are formed on the global STI region 700B. A gate spacer 1030 is formed over the sacrificial gates 1000, 1002, 1004, 1006, and 1008, the semiconducting layer 302, and the global STI region 700B. In some embodiments, the gate spacer 1030 is conformally deposited using, for example, ALD.

Figure 11:
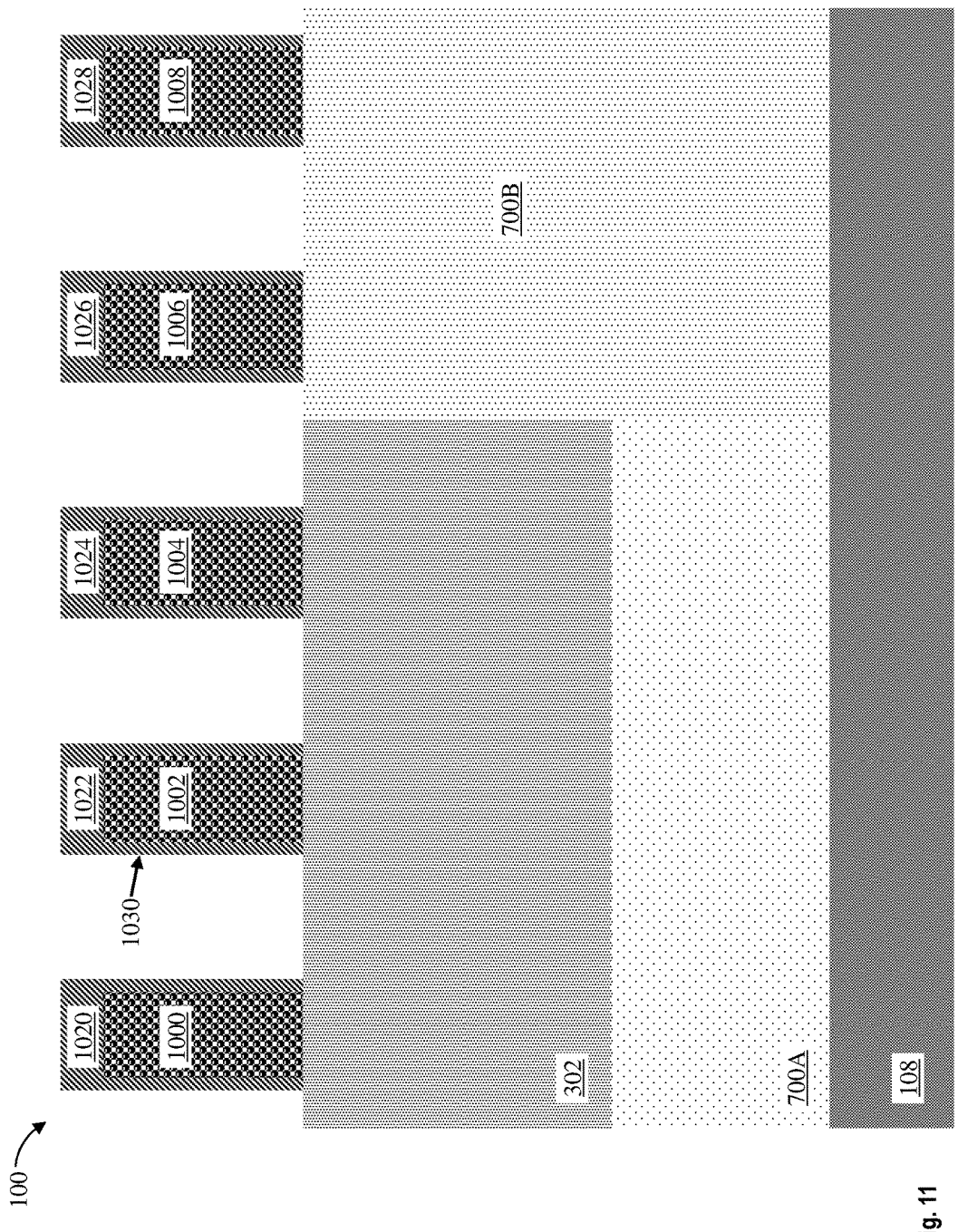
FIG. 11 depicts a cross-sectional view of the structure along the line Y-Y' of FIG. 8 after removing portions of the gate spacer to expose a surface of the semiconducting layer and a surface of the global STI region during an intermediate operation of a method of fabricating a semiconductor device according to one or more embodiments of the present invention.

FIG. 11 illustrates a cross-sectional view of the structure 100 along the line Y-Y' of FIG. 8 after removing portions of the gate spacer 1030 to expose a surface of the semiconducting layer 302 and a surface of the global STI region 700B during an intermediate operation of a method of fabricating a semiconductor device according to one or more embodiments. In some embodiments, the portions of the gate spacer 1030 are removed using directional RIE.

Figure 12:
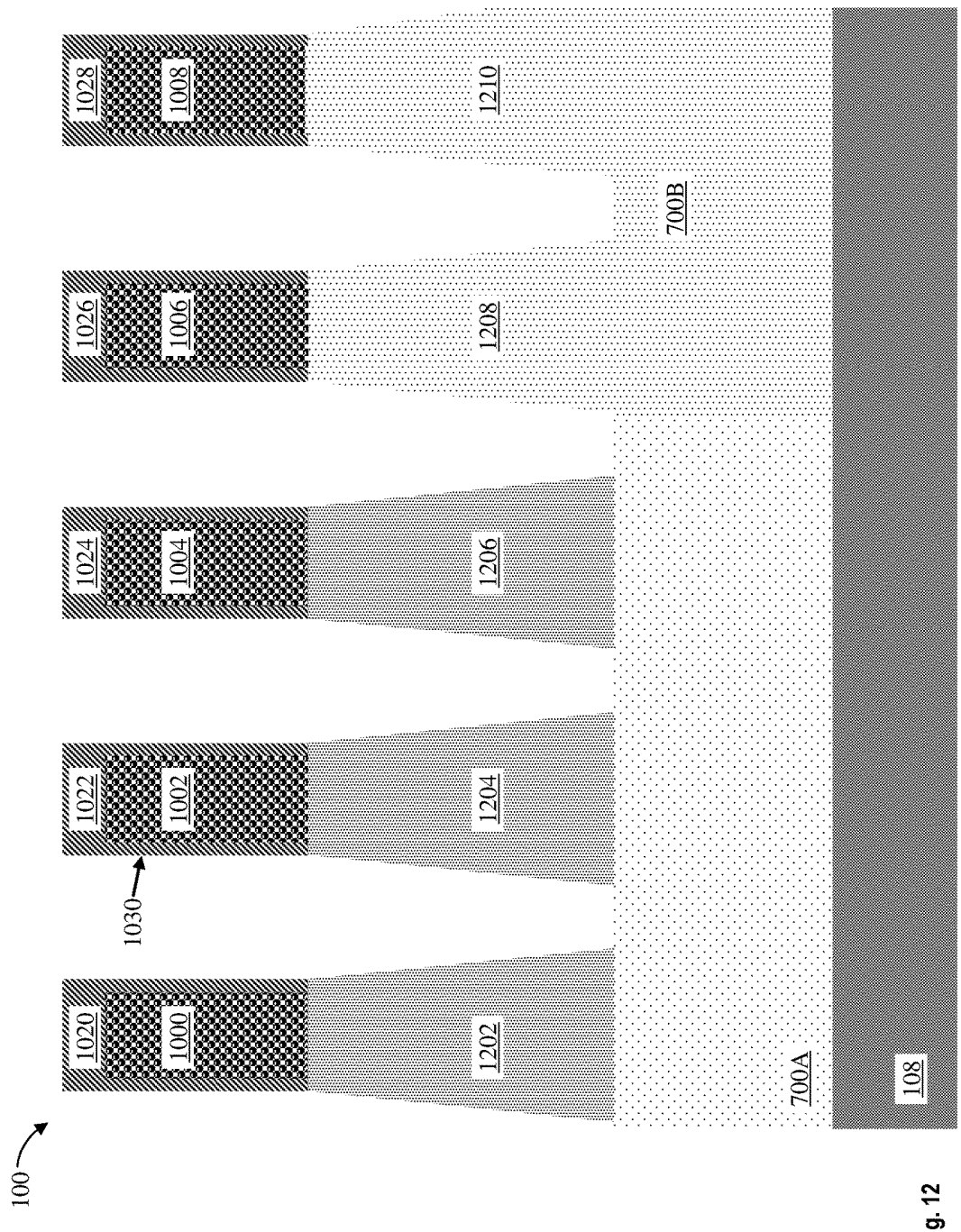
FIG. 12 depicts a cross-sectional view of the structure along the line Y-Y' of FIG. 8 after removing portions of semiconducting layer and portions of the global STI region to expose a surface of the local STI region during an intermediate operation of a method of fabricating a semiconductor device according to one or more embodiments of the present invention.

FIG. 12 illustrates a cross-sectional view of the structure 100 along the line Y-Y' of FIG. 8 after removing portions of semiconducting layer 302 and portions of the global STI region 700B to expose a surface of the local STI region 700A during an intermediate operation of a method of fabricating a semiconductor device according to one or more embodiments. Removing portions of semiconducting layer 302 forms epitaxy pillars 1202, 1204, and 1206 beneath sacrificial gates 1000, 1002, and 1004, respectively. Removing portions of the global STI region 700B forms dielectric pillars 1208 and 1210 beneath sacrificial gates 1006 and 1008, respectively. The portions of the semiconducting layer 302 and global STI region 700B can be removed using any know process, such as, for example, a wet or dry etch. In some embodiments, the portions of the semiconducting layer 302 and global STI region 700B are removed using RIE.

Figure 13:
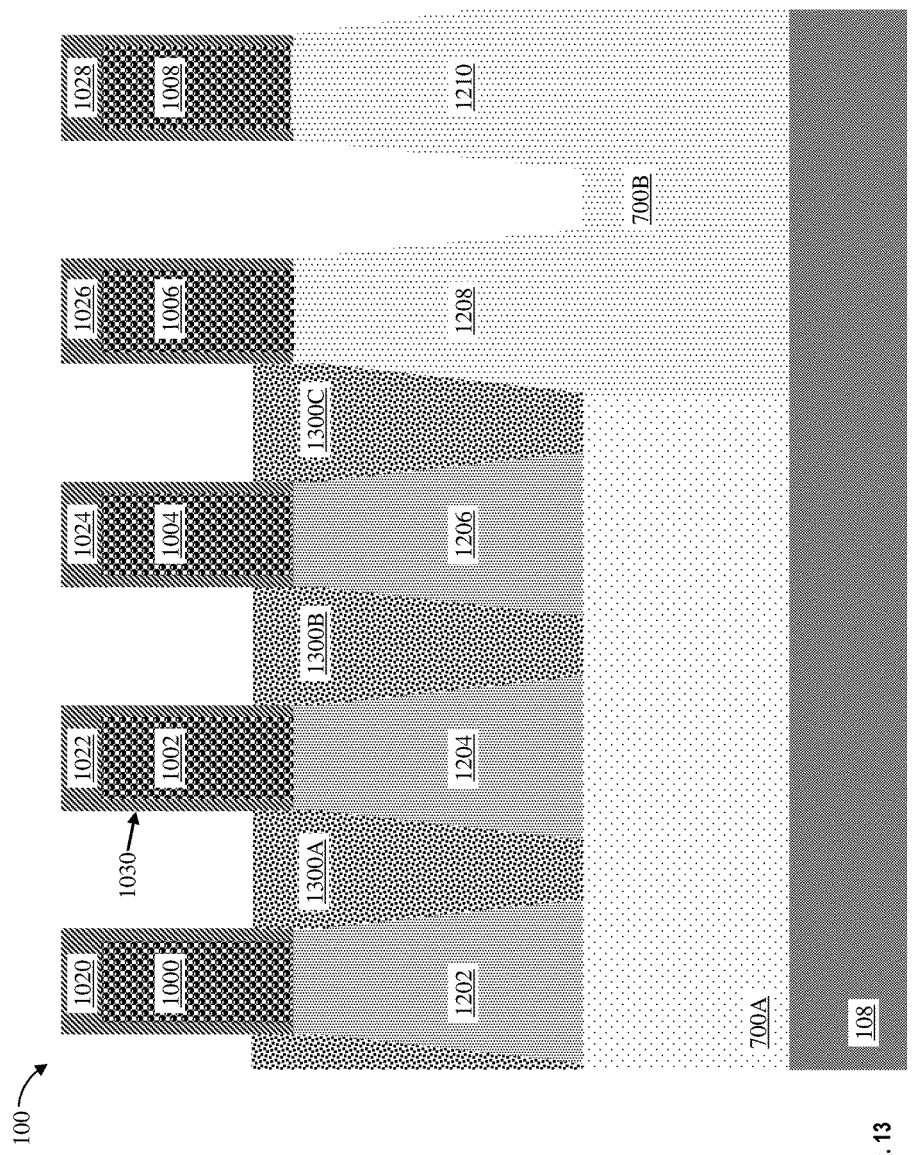
FIG. 13 depicts a cross-sectional view of the structure along the line Y-Y' of FIG. 8 after forming epitaxy regions on surfaces of the epitaxy pillars during an intermediate operation of a method of fabricating a semiconductor device according to one or more embodiments of the present invention.

FIG. 13 illustrates a cross-sectional view of the structure 100 along the line Y-Y' of FIG. 8 after forming epitaxy regions 1300A, 1300B, and 1300C on surfaces of the epitaxy pillars 1202, 1204, and 1206 during an intermediate operation of a method of fabricating a semiconductor device according to one or more embodiments. In some embodiments, an epitaxy pre-clean process removes oxides and other contaminates from the surfaces of the epitaxy pillars 1202, 1204, and 1206 prior to forming the epitaxy regions 1300A, 1300B, and 1300C.

The epitaxy regions 1300A, 1300B, and 1300C can be source or drain regions. Any known manner of forming the epitaxy regions 1300A, 1300B, and 1300C can be utilized. In some embodiments, epitaxial growth, CVD, ECD, MBE, or ALD is employed to form the epitaxy regions 1300A, 1300B, and 1300C. In some embodiments, the epitaxy regions 1300A, 1300B, and 1300C extend beyond a top surface of the epitaxy pillars 1202, 1204, and 1206. In some embodiments, the epitaxy regions 1300A, 1300B, and 1300C are in-situ doped. In some embodiments, the epitaxy regions 1300A, 1300B, and 1300C are formed using ultra-high vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), or molecular beam epitaxy (MBE). Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm-3 to $2\times10^{21}$ cm$^{-3}$, or between $2\times10^{20}$ cm$^{-3}$ to $1\times10^{21}$ cm$^{-3}$.

In some embodiments, the epitaxy regions 1300A, 1300B, and 1300C are selectively formed (e.g., using epitaxial growth) on surfaces of the epitaxy pillars 1202, 1204, and 1206. In this manner, the epitaxy regions do not form on surfaces of the dielectric pillars 1208 and 1210.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a semiconductor device, the method comprising:
    forming a first and a second semiconductor fin on a substrate, the first semiconductor fin adjacent to the second semiconductor fin;
    forming a buffer layer on a surface of the substrate between the first and second semiconductor fins;
    forming a semiconducting layer on the buffer layer to define a fin height of the first and second semiconductor fins;
    replacing the buffer layer with a dielectric layer;
    forming a first gate over a first channel region of the first semiconductor fin and a second gate over a second channel region of the first semiconductor fin; and
    selectively forming a source epitaxy on a first surface of the first gate and a drain epitaxy on a second surface of the first gate.

2. The method of claim 1, wherein the first gate is formed on a local shallow trench isolation (STI) region and the second gate is formed on a global STI region.

3. The method of claim 1 further comprising forming spacers on each of the first and second semiconductor fin sidewalls.

4. The method of claim 3, wherein the spacers are a low-k dielectric, a nitride, silicon nitride, a silicon oxynitride (SiON), a silicon carbide (SiC), a silicon oxygen carbonitride (SiOCN), or a silicoboron carbonitride (SiBCN).

5. The method of claim 1, wherein the buffer layer comprises SiGe.

6. The method of claim 1, wherein the dielectric layer comprises a silicon nitride.

7. The method of claim 1, wherein the semiconducting layer comprises silicon.

8. The method of claim 1, wherein the first gate and the second gate each comprise amorphous silicon.

9. The method of claim 1, wherein replacing the buffer layer with a dielectric layer further comprises selectively etching the buffer layer.

10. A method for forming a semiconductor device, the method comprising:
    forming a plurality of adjacent semiconductor fins on a substrate, each semiconductor fin comprising a first sidewall and a second sidewall;
    forming a buffer layer on a surface of the substrate between each of the semiconductor fins;
    forming a semiconducting layer on the buffer layer;
    selectively removing the buffer layer; and
    forming a dielectric layer to replace the removed buffer layer.

11. The method of claim 10 further comprising:
    forming a first gate over a first channel region of each of the plurality of semiconductor fins and a second gate over a second channel region of the plurality of semiconductor fins; and
    selectively forming a source epitaxy on a first surface of the first gate and a drain epitaxy on a second surface of the first gate.

12. The method of claim 10 further comprising forming spacers on each of the semiconductor fin sidewalls.

13. The method of claim 12, wherein the spacers are a low-k dielectric, a nitride, silicon nitride, a silicon oxynitride (SiON), a silicon carbide (SiC), a silicon oxygen carbonitride (SiOCN), or a silicoboron carbonitride (SiBCN).

14. The method of claim 10, wherein the buffer layer comprises SiGe, the dielectric layer comprises a silicon nitride, the semiconducting layer comprises silicon, and the first gate and the second gate each comprise amorphous silicon.

\* \* \* \* \*